US010020105B2

(12) United States Patent
Park et al.

(10) Patent No.: US 10,020,105 B2
(45) Date of Patent: Jul. 10, 2018

(54) CIRCUIT PROTECTION DEVICE HAVING NOISE FILTERS

(71) Applicant: INNOCHIPS TECHNOLOGY CO., LTD., Ansan-Si, Gyeonggi-Do (KR)

(72) Inventors: In Kil Park, Seongnam-Si (KR); Tae Hyung Noh, Siheung-Si (KR); Myung Ho Lee, Ansan-Si (KR); Song Yeon Lee, Ansan-Si (KR); Jung Hun Lee, Ansan-Si (KR); Hyun Mo Kang, Ansan-Si (KR)

(73) Assignee: INNOCHIPS TECHNOLOGY CO., LTD. (KR)

( * ) Notice: Subject to any disclaimer, the term of this patent is extended or adjusted under 35 U.S.C. 154(b) by 188 days.

(21) Appl. No.: 14/986,447

(22) Filed: Dec. 31, 2015

(65) Prior Publication Data
US 2017/0133142 A1   May 11, 2017

(30) Foreign Application Priority Data

Nov. 11, 2015 (KR) ........................ 10-2015-0158473

(51) Int. Cl.
H01F 17/00 (2006.01)
H01F 27/24 (2006.01)
(Continued)

(52) U.S. Cl.
CPC ......... H01F 17/0013 (2013.01); H01F 19/04 (2013.01); H01F 27/24 (2013.01);
(Continued)

(58) Field of Classification Search
CPC ................. H01F 17/0013; H01F 19/04; H01F 2017/0093; H01F 27/24; H01F 27/29; H01F 27/292; H02H 9/04; H03H 7/01
See application file for complete search history.

(56) References Cited

U.S. PATENT DOCUMENTS 5,404,118 A * 4/1995 Okamura ............ H01P 1/20345
333/175
7,085,118 B2 * 8/2006 Inoue ........................ H01C 1/16
361/119
(Continued)

FOREIGN PATENT DOCUMENTS

JP      200472006 A     3/2004
JP     2004072006 A  *  3/2004
(Continued)

OTHER PUBLICATIONS

International Search Report for PCT/KR2015/013033 dated Jul. 18, 2016.
(Continued)

Primary Examiner — Thienvu Tran
Assistant Examiner — Nicolas Bellido
(74) Attorney, Agent, or Firm — Renaissance IP Law Group LLP

(57) ABSTRACT

The present disclosure includes: a laminate in which a plurality of sheets are laminated; two or more noise filters provided spaced apart by a predetermined distance from each other in the laminate and respectively provided with a plurality of coil patterns; an external electrode provided outside the laminate and connected to the two or more noise filters; and a connection electrode provided outside the laminate being spaced apart from the external electrode to connect the two or more coil patterns.

14 Claims, 8 Drawing Sheets

(51) Int. Cl.
  *H02H 9/04* (2006.01)
  *H01F 27/29* (2006.01)
  *H01F 19/04* (2006.01)
  *H03H 7/01* (2006.01)
  *H03H 1/00* (2006.01)

(52) U.S. Cl.
  CPC ............ *H01F 27/29* (2013.01); *H01F 27/292* (2013.01); *H02H 9/04* (2013.01); *H03H 1/0007* (2013.01); *H03H 7/01* (2013.01); *H01F 2017/0093* (2013.01); *H03H 2001/0085* (2013.01)

(56) References Cited

U.S. PATENT DOCUMENTS

| | | | | |
|---|---|---|---|---|
| 7,652,554 B2 * | 1/2010 | Moriai | ................. | H01C 7/1006 338/61 |
| 2003/0134612 A1 * | 7/2003 | Nakayama | .......... | H01F 17/0013 455/307 |
| 2004/0070468 A1 * | 4/2004 | Harada | ............... | H01P 1/20345 333/185 |
| 2009/0295526 A1 * | 12/2009 | Mikami | ............... | C01G 49/009 336/196 |
| 2010/0046130 A1 * | 2/2010 | Park | ................... | H01F 17/0033 361/56 |
| 2014/0152398 A1 | 6/2014 | Kayahara | | |
| 2014/0176287 A1 | 6/2014 | Kato | | |
| 2014/0298647 A2 * | 10/2014 | Anthony | .................. | H01G 4/40 29/825 |
| 2014/0333406 A1 * | 11/2014 | Yang | ................... | H01F 17/0013 336/200 |
| 2014/0347773 A1 | 11/2014 | Park et al. | | |

FOREIGN PATENT DOCUMENTS

| | | | | |
|---|---|---|---|---|
| JP | 2006351962 A | * | 12/2006 | |
| JP | 2012195332 A | * | 10/2012 | |
| JP | 2012248917 A | * | 12/2012 | |
| JP | 2014013824 A | * | 1/2014 | |
| JP | 2014123643 A | | 7/2014 | |
| JP | 2014212189 A | * | 11/2014 | |
| KR | 100876206 B1 | | 12/2008 | |
| KR | 20120033644 A | | 4/2012 | |
| KR | 20130101849 A | | 9/2013 | |
| KR | 101445741 B1 | | 10/2014 | |
| WO | WO 2009044941 A1 | * | 4/2009 | ............... H03H 3/02 |

OTHER PUBLICATIONS

Translated Written Opinion for PCT/KR2015/013033 dated May 24, 2018.

* cited by examiner

3100 : 3110, 3120
3200 : 3210, 3220
3000 : 3100, 3200
4000 : 4100, 4200

1000 : 110, 120, 130, 140, 150, 160, 170, 180, 190
2000 : 2100, 2200
2100 : 210, 220, 230, 240, 410, 420, 430, 440
2200 : 250, 260, 270, 280, 450, 460, 470, 480

3100 : 3110, 3120
3200 : 3210, 3220
3000 : 3100, 3200
4000 : 4100, 4200

1000 : 110, 120, 130, 140, 150, 160, 170, 180, 190
2000 : 2100, 2200
2100 : 210, 220, 230, 240, 410, 420, 430, 440
2200 : 250, 260, 270, 280, 450, 460, 470, 480

CIRCUIT PROTECTION DEVICE HAVING NOISE FILTERS

CROSS-REFERENCE TO RELATED APPLICATION

This application claims priority to Korean Patent Application No. 10-2015-0158473 filed on Nov. 11, 2015 and all the benefits accruing therefrom under 35 U.S.C. § 119, the contents of which are incorporated by reference in their entirety.

BACKGROUND

The present disclosure relates to a circuit protection device, and more particularly, to a circuit protection device having one laminate in which at least two or more common mode noise filters are provided, thereby suppressing noises in at least two or more frequency bands.

Recently, as portable electronic apparatuses such as smart phones become multi-functional, various frequency bands are used. That is, a plurality of functions including a wireless LAN, a Bluetooth, and a GPS using different frequency bands are employed in one smart phone. Also, the internal circuit density in a limited internal space of an electronic apparatus increases in accordance with high integration of the electronic apparatuses, and thus noise interference is inevitably generated between internal circuits. For example, a noise of 750 MHz degrades call quality of the smart phone, and a noise of 1.5 GHz degrades GPS quality.

A plurality of circuit protection devices are used to suppress various frequency noises in portable electronic apparatuses as well as to suppress the noise between internal circuits. For example, a condenser, a chip bead, and a common mode filter are respectively used to eliminate noises in respective different frequency bands. The common mode filter has a structure in which two choke coils are integrated into one element, and may pass signal current of a differential mode therethrough and remove only noise current of a common mode. That is, the common mode filter may classify the signal current of the differential mode, which is alternating current, and the noise current of the common mode, and may remove the noise current of common mode.

Although it is desirable to remove all the noises degrading the call quality of the smart phone and the GPS quality, the existing common mode noise filter may remove only a noise with a certain frequency, and fail to remove noises with other frequencies. Thus, the quality of any one of the functions is inevitably degraded by the noises.

RELATED ART DOCUMENT

Korea Patent No. 10-0876206

SUMMARY

The present disclosure provides a circuit protection device having a laminate in which at least two common mode noise filters are provided.

The present disclosure also provides a circuit protection device which may suppress noises with at least two or more frequencies.

In accordance with an exemplary embodiment, a circuit protection device includes: a laminate in which a plurality of sheets are laminated; at least two or more noise filters provided in the laminate and spaced apart by a predetermined distance from each other, each of the noise filters having a plurality of coil patterns; an external electrode provided outside the laminate and connected to the two or more noise filters; and a connection electrode spaced apart from the external electrode and configured to connect at least two of the plurality of coil patterns.

In accordance with an exemplary embodiment, the two or more noise filters may be disposed spaced apart by a predetermined distance from each other in a direction in which the sheets are laminated.

In accordance with an exemplary embodiment, the connection electrode may be provided outside the laminate, or may be formed inside the laminate to penetrate the plurality of sheets.

In accordance with an exemplary embodiment, the two or more noise filters may be connected to each other in series while sharing the connection electrode, or may be provided in parallel while each of the two or more noise filters has the connection electrode.

In accordance with an exemplary embodiment, the external electrode may be connected to one terminal and the other terminal of the circuit, and the connection electrode may be floated from the circuit.

In accordance with an exemplary embodiment, the noise filter may include: the plurality of coil patterns respectively formed on the plurality of sheets; a plurality of vertical connection lines formed on a selected sheet to connect at least two or more of the plurality of coil patterns; and a plurality of lead electrodes led to outside from each of the plurality of coil patterns to be selectively connected to the external electrode and the connection electrode.

In accordance with an exemplary embodiment, a first noise filter may include first to fourth coil patterns in a direction in which the sheets are laminated, the first and second coil patterns being respectively connected to any one of the third or fourth coil patterns to constitute first and second inductors, respectively, and a second noise filter may be spaced apart from the first noise filter and include fifth to eighth coil patterns in the direction in which the sheets are laminated, the fifth and sixth coil patterns being respectively connected to any one of the seventh or eighth coil patterns to constitute each of third and fourth inductors, respectively.

In accordance with an exemplary embodiment, two coil patterns selected from the first to fourth coil patterns may be respectively connected to two coil patterns selected from the fifth to eighth coil patterns through one sided connection electrode and another sided connection electrode.

In accordance with an exemplary embodiment, a parasitic inductance and an insertion loss frequency may be adjusted in accordance with a distance between the two or more noise filters.

In accordance with an exemplary embodiment, the insertion loss frequency may be adjusted to approximately 0.4 GHz to approximately 5 GHz in accordance with the distance between the noise filters.

In accordance with an exemplary embodiment, the two or more noise filters are different from each other in number of turns of the coil patterns.

In accordance with an exemplary embodiment, the two or more noise filters may further include a magnetic core formed in the center of at least one coil pattern of the two or more noise filters.

In accordance with an exemplary embodiment, the circuit protection device may further include an ESD protection device provided in lower or upper side of the two or more noise filters to shield the ESD.

In accordance with an exemplary embodiment, the ESD protection device may include a plurality of holes filled with ESD protection material and a second lead electrode led to the outside from the holes to be connected to the external electrode.

In accordance with an exemplary embodiment, the ESD protection device may further include a third lead electrode formed in a direction orthogonal to the second lead electrode.

In accordance with an exemplary embodiment, the third lead electrode may further include a second external electrode which is spaced apart from the external electrode and the connection electrode and is connected to a ground terminal.

BRIEF DESCRIPTION OF THE DRAWINGS

Exemplary embodiments may be understood in more detail from the following description taken in conjunction with the accompanying drawings, in which.

DETAILED DESCRIPTION OF EMBODIMENTS

Figure 1:
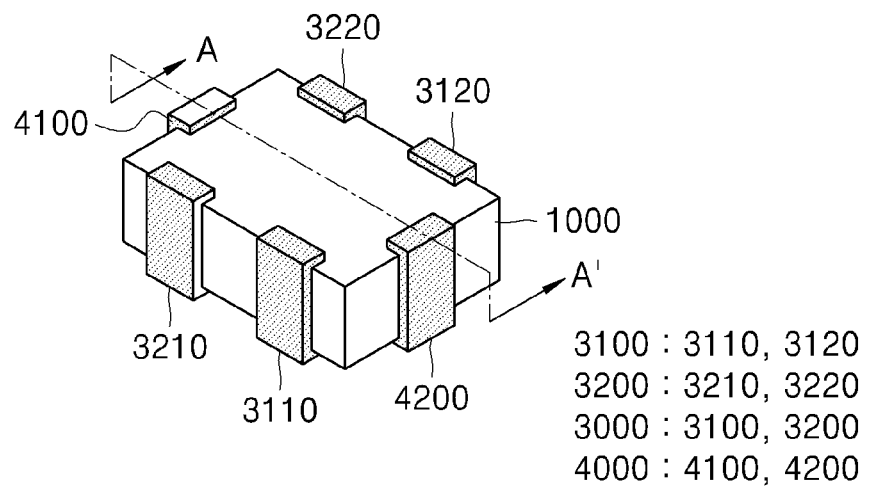
FIG. 1 is a perspective view illustrating an assembled circuit protection device in accordance with an exemplary embodiment of the present disclosure.

Hereinafter, specific embodiments will be described in detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. In the figures, the dimensions of layers and regions are exaggerated for clarity of illustration. Like reference numerals refer to like elements throughout.

Figure 2:
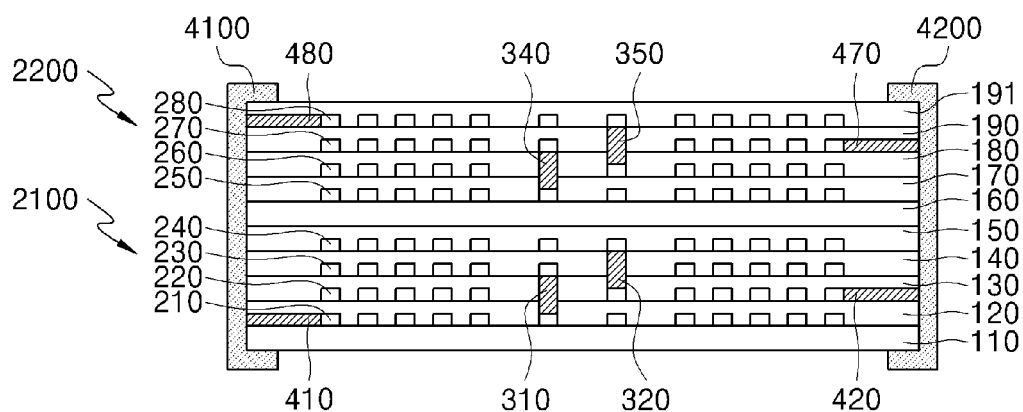
FIG. 2 is a sectional view taken along line A-A' of FIG. 1.
Figure 3:
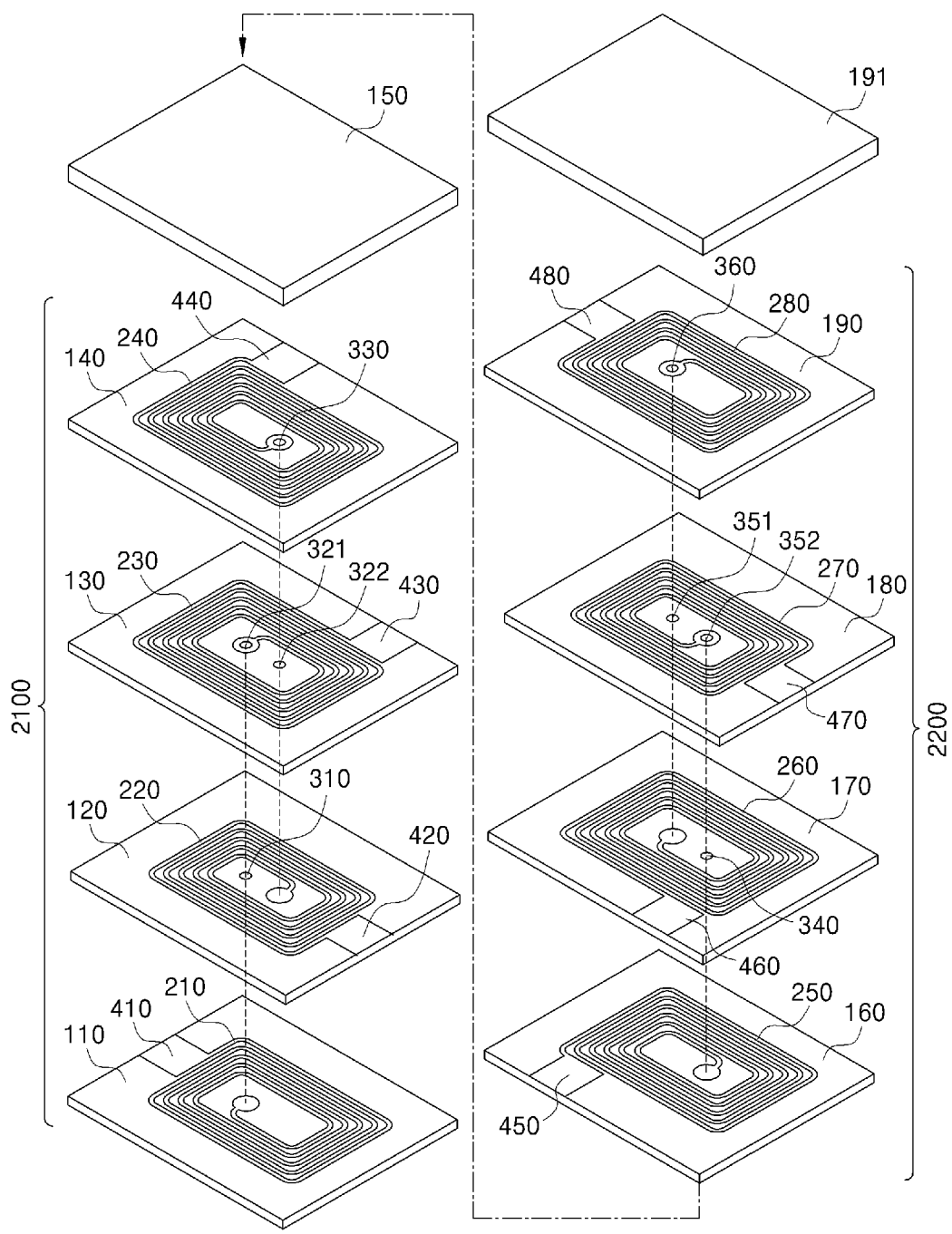
FIG. 3 is an perspective view illustrating an exploded circuit protection device in accordance with an exemplary embodiment of the present disclosure.
Figure 4:
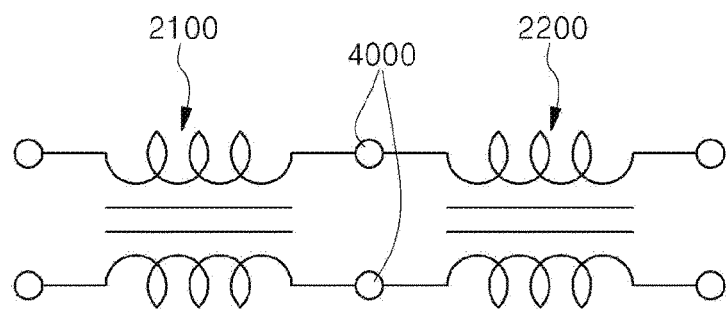
FIG. 4 is an equivalent circuit diagram of a circuit protection device in accordance with an embodiment of the present disclosure.

FIG. 1 is a perspective view illustrating an assembled circuit protection device in accordance with an embodiment of the present disclosure, FIG. 2 is a sectional view taken along line A-A' of FIG. 1, and FIG. 3 is an exploded view. Also, FIG. 4 is an equivalent circuit diagram of the circuit protection device in accordance with an embodiment of the present disclosure.

Referring to FIGS. 1 to 3, a circuit protection device in accordance with an embodiment of the present disclosure includes a laminate 1000 in which a plurality of insulation sheets 100 are laminated, and at least two or more common mode noise filters 2100 and 2200 (2000) each including a plurality of coil patterns 200 are provided in the laminate 1000. The two or more common mode noise filters 2000 are provided spaced apart by a predetermined distance from each other in a direction in which the sheets 100 are laminated. Also, the circuit protection device may further include external electrodes 3100 and 3200 (3000) which are formed on two side surfaces of the laminate 1000 opposed to each other and connected to at least two or more common mode noise filters 2000, and connection electrodes 4100 and 4200 (4000) which are formed on at least one side surface of the laminate 1000 and configured to connect the at least two or more common mode noise filters 2000 to each other. That is, as illustrated in FIG. 4, in the circuit protection device in accordance with an embodiment of the present disclosure, at least two or more common mode noise filters 2100 and 2200 each including a plurality of coil patterns 200 are connected in series by the connection electrode 4000.

The laminate 1000 is formed by a plurality of insulation sheets 110 to 191 (100) being laminated, and the at least two or more common mode noise filters 2000 are provided in the laminate 1000. The at least two or more common mode noise filters 2000 are provided spaced apart by a predetermined distance from each other, for example, in a direction in which the sheets 100 to 191 are laminated, i.e. in a vertical direction. Meanwhile, the laminate 1000 may further include an upper cover layer (not illustrated) and a lower cover layer (not illustrated) respectively provided in upper and lower portions thereof. The upper and lower cover layers may be respectively provided by a plurality of magnetic sheets being laminated. Also, the upper and lower cover layers may be provided in the same thickness, or may be provided in a thickness that is less than or equal to that of the common mode noise filters 2000 provided therebetween.

The common mode noise filters 2000 may include: the plurality of coil patterns 200 selectively formed on the plurality of sheets 100; holes 300 filled with a conductive material, the conductive material functioning as a vertical connection line vertically connecting the coil patterns 200; and lead electrodes 400 led from the coil pattern 200 so as to be exposed to outside of the sheets 100. That is, the coil patterns 210 to 280 (200) are respectively formed on the plurality of sheets 100, and at least two or more coil patterns 200 in a vertical direction in which the sheets 100 are laminated are connected to each other through the holes 310 to 360 (300) filled with the conductive material, i.e. the vertical connection lines. Thus, the plurality of coil patterns, for example, four coil patterns connected in a vertical direction respectively form one of the common mode noise filters 2000, and for example, the two common mode noise filters 2100 and 2200; 2000 are laminated spaced apart from each other in the vertical direction. That is, the at least two or more common mode noise filters 2000 are formed spaced apart by a predetermined distance from each other in a direction in which the sheets 100 are laminated. Also, the at least two or more common mode noise filters 2000 are connected to each other by the connection electrodes 4000 outside the laminate 1000. That is, at least two selected coil patterns 200 of each of the at least two or more common mode noise filters 2000 are connected to each other by the connection electrodes 400 outside the laminate 1000. Thus, in accordance with an embodiment of the present disclosure, the at least two or more common mode noise filters 2000 in the laminate 1000 are connected in series to each other.

A first common mode noise filter 2100 includes: coil patterns 210 to 240 formed on first to fourth sheets 110 to 140; holes 310, 321, 322, and 330 filled with a conductive material; and lead electrodes 410 to 440. The coil pattern 210 and the lead electrode 410 are formed on the first sheet 110; the coil pattern 220, the hole 310 filled with the conductive material and the lead electrode 420 are formed on the second sheet 120; the coil pattern 230, the holes 321 and 322 filled with the conductive material, and a lead electrode 430 are formed on the third sheet 130; and the coil pattern 240, the hole 330 filled with the conductive material, and the lead hole 440 are formed on the fourth sheet 140. The coil pattern 210 on the first sheet 110 and the coil pattern 230 on the third sheet 130 are connected to each other through the hole 310 of the second sheet 120 filled with the conductive material and the hole 321 of the third sheet 130 filled with the conductive material, and the coil pattern 220 on the second sheet 120 and the coil pattern 240 on the fourth sheet 140 are connected to each other through the hole 322 of the third sheet 130 filled with the conductive material and the hole 330 of the fourth sheet 140 filled with the conductive material. That is, since one coil pattern skips the coil pattern adjacent thereto in a vertical direction and is connected to the next coil pattern after one, the coil patterns 210 to 240 are alternately connected to each other. The coil patterns 210 and 230 constitute a first inductor, and the coil pattern 220 and 240 constitute a second inductor. The coil pattern 210 on the first sheet 110 and the coil pattern 240 on the fourth sheet 140 may be connected to each other through the holes formed therebetween and filled with the conductive material, and the coil pattern 220 on the second sheet 120 and the coil pattern 230 on the third sheet 130 may also be connected to each other through the holes formed therebetween and filled with the conductive material. Thus, the first common mode noise filter 2100 having the first and second inductors which are composed of the coil patterns 210 to 240 respectively formed on the first to fourth sheets 110 to 140 and the holes 310 to 330 filled with the conductive material is formed. That is, the first common mode noise filter 2100 is composed of the first and second inductors which respectively include two coil patterns 200.

The second common mode noise filter 2200 is formed on the first common mode noise filter 2100 with a sheet 150 having a predetermined thickness in-between, and includes: coil patterns 250 to 280 formed on the plurality of sheets 160 to 190; holes 340, 351, 352, and 360 filled with a conductive material; and lead electrodes 450 to 480. That is, the coil pattern 250 formed on the sixth sheet 160 is connected to the coil pattern 270 formed on the eighth sheet 180 through the holes 340 and 352 that are respectively formed in the seventh and eighth sheets 170 and 180 and filled with the conductive material, i.e. through a vertical connection line, to implement a third inductor. The coil pattern 260 formed on the seventh sheet 170 is connected to the coil pattern 280 formed on the ninth sheet 190 through the holes 351 and 360 that are respectively formed on the eighth and ninth sheets 180 and 190 and filled with the conductive material to implement a fourth inductor. Of course, the coil pattern 250 formed on the sixth sheet 160 is connected to the coil pattern 280 formed on the ninth sheet 190 through a vertical connection line, and the coil pattern 260 formed on the seventh sheet 170 may also be connected to the coil pattern 270 formed on the eighth sheet 180 through a vertical connection line. Thus, the second common mode noise filter 2200 having the third and fourth inductors which are formed by the coil patterns 250 to 280 respectively formed on the fifth to ninth sheets 160 to 190 and the holes 340 to 360 filled with the conductive material is formed. That is, the second common mode noise filter 2200 is composed of the third and fourth inductors which respectively include the two coil patterns 200.

Also, the coil pattern 210 on the first sheet 110 and the coil pattern 280 on the ninth sheet 190 are connected to the first connection electrode 4100 through respective lead electrodes 410 and 480 thereof, and the coil pattern 220 on the second sheet 120 and the coil pattern 270 on the eighth sheet 180 are connected to the second connection electrode 4200 through respective lead electrodes 420 and 470 thereof. The coil pattern 210 on the first sheet 110 and the coil pattern 270 on the eighth sheet 180 are connected to the first connection electrode 4100 through the respective lead electrodes thereof, and the coil pattern 220 on the second sheet 120 and the coil pattern 280 on the ninth sheet 190 may also be connected to the second connection electrode 4200 through the respective lead electrodes thereof. That is, two coil patterns of the first common mode noise filter 2100 are respectively connected to two coil patterns of the second common mode noise filter 2200 through the connection electrode 4000. The coil pattern 230 on the third sheet 130 and the coil pattern 260 on the seventh sheet 170 are connected to a first external electrode 3100 through the respective lead electrodes 430 and 460 thereof, and the coil pattern 240 on the fourth sheet 140 and the coil pattern 250 on the sixth sheet 160 are connected to a second external electrode 3200 through the respective lead electrodes 440 and 450 thereof. Thus, the first and second common mode noise filters 2100 and 2200 are connected to each other in series by the external electrodes 3000 and the connection electrodes 4000.

Meanwhile, the coil patterns 210 to 240 constituting the first common mode noise filter 2100 are equal to each other in the number of turns, and the coil patterns 250 to 280 constituting the second common mode noise filter 2200 may also be equal to each other in the number of turns. However, in the first and second common mode noise filters 2100 and 2200 (2000), the coil patterns 200 may be different from each other in the number of turns. That is, the number of turns of the coil patterns 210 to 240 may be different from the number of turns of the coil patterns 250 to 280. For example, the first common mode noise filter 2100 may have the same or less number of turns of the coil patterns than the second common mode noise filter 2200, and a ratio of the number of turns of the coil patterns may be, for example, approximately 1:1 to approximately 1:10. Since the coil patterns 200 respectively constituting the first and second common mode noise filters 2100 and 2200 are different in the number of turns from each other, one circuit protection device may have at least two or more impedance characteristics.

The external electrodes 3000 may be respectively provided on two side surfaces of the laminate 1000 opposed to each other. That is, when the direction in which the sheets 100 are laminated is determined as a vertical direction, the external electrodes 3000 may be formed on first and third side surfaces opposed to each other in a horizontal direction perpendicular to the vertical direction of the laminate 1000. Also, the external electrodes 3000 may be provided by two on the first and third side surfaces. That is, the external electrodes 3000 may be formed by two on each of the first and third side surfaces with respect to the two common mode noise filters 2100 and 2200. Particularly, the first external electrodes 3110 and 3120 connected to the first and second common mode noise filters 2100 and 2200 are formed on the first and third side surfaces to be opposed to each other, and the second external electrodes 3210 and 3220 connected to the first and second common mode noise filters 2100 and 2200 are spaced apart from the first external electrodes 3110 and 3120, and formed on the first and third side surfaces to be opposed to each other. The external electrodes 3000 are connected to the first and second common mode noise filters 2100 and 2200 inside the laminate 1000, and may be connected to input and output terminals outside the laminate 1000. For example, the external electrodes 3000 formed on the first side surface of the circuit protection device, i.e. the first external electrodes 3110 and 3210, are connected to a signal input terminal, and the corresponding external electrodes 3000 formed on the third side surface, i.e. the second external electrodes 3120 and 3220, may be connected to an output terminal, for example, a system.

The connection electrodes 4000 may be provided to connect at least two or more common mode noise filters 2000. That is, at least two coil patterns 200 which are included in the common mode noise filters 2000 different from each other are connected to each other through the connection electrodes 4000 so as to connect the at least two or more common mode noise filters 2000 to each other. The connection electrodes 4000 may be formed outside the laminate 1000, and may be formed on at least one side surface of the laminate 1000 on which the external electrodes 3000 are not formed. That is, the external electrodes 3000 are formed on the first and third side surfaces of the laminate 1000, and the connection electrodes 4000 may be formed on second and fourth side surfaces of the laminate 1000 on which the external electrodes 3000 are not formed. Also, in the connection electrodes 4000, a first connection electrode 4100 is formed on the third side surface of the laminate 1000, and a second connection electrode 4200 is formed on the fourth side surface of the laminate 1000. The first and second connection electrodes 4100 and 4200 allow different coil patterns of the first and second common mode noise filters 2100 and 2200 to be connected to each other respectively. Meanwhile, the connection electrodes 4000 are floated on the circuit. That is, the connection electrodes 4000 function to connect at least two coil patterns 200 of each of common mode noise filters 2000 to each other, and are not connected to other external circuits such as input and output terminals, a ground terminal, or the like. While the embodiment of the present disclosure illustrates that the connection electrodes 4000 are formed outside the laminate 1000, the connection electrodes 4000 may be formed inside the laminate 1000. That is, a through hole is defined outside the coil patterns 200 of at least two sheets selected from the plurality of sheets 100, and the through hole is then filled with a conductive material so as to function as the connection electrodes 4000 connecting the upper and lower coil patterns 200 to each other. Characteristics of the common mode noise filters 2000 may be improved by using a parasitic inductance of the connection electrodes 4000. The parasitic inductance of the connection electrodes 4000 changes depending on a distance between the first and second common mode noise filters 2100 and 2200. For example, the parasitic inductance increases as the distance between the common mode noise filters 2000 increases, and the parasitic inductance decreases as the distance decreases. The common mode noise filters 2000 have the distance of, for example, approximately 5 μm to approximately 500 μm. Also, an insertion loss frequency decreases as the parasitic inductance of the connection electrodes 4000 increases, and increases as the parasitic inductance decreases. Thus, the parasitic inductance of the connection electrodes 4000 may be adjusted by adjusting the distance between at least two or more common mode noise filters 2000, and accordingly the insertion loss frequency may be adjusted. For example, the insertion loss frequency may be adjusted to approximately 0.4 GHz to approximately 5 GHz. Also, a low insertion loss characteristic in a desired frequency band and a wide bandwidth may be implemented by connecting at least two or more common mode noise filters 2000 to each other using the connection electrodes 4000. Thus, since noises with various frequencies may be removed, a noise removal characteristic may be improved.

Meanwhile, although the plurality of spiral coil patterns formed on different layers are connected to each other to implement one of the common mode noise filters 2000 in the above embodiment, the coil patterns may not be formed in the spiral shape, but a conductive pattern formed on at least one layer may have various shapes such as a linear shape, curved shape, or the like. That is, the common mode noise filters 2000 in accordance with the present disclosure may have a plurality of conductive patterns vertically connected, and at least any one of the plurality of conductive patterns has the spiral shape, while at least another one thereof may have another shape which is not the spiral shape.

The common mode noise filter of the circuit protection device in accordance with an embodiment of the present disclosure is described in more detail with reference to an exploded perspective view of FIG. 3 as follows.

Referring to FIG. 3, the circuit protection device in accordance with an embodiment of the present disclosure may include: the plurality of sheets 110 to 190; the plurality of coil patterns 210 to 280 respectively formed on the plurality of sheets 100; the holes 310 to 360 filled with a conductive material and selectively formed in the plurality of sheets 100; and the lead electrodes 410 to 480 (400) selectively formed on the plurality of the sheets 100, connected to the plurality of coil patterns 200 and led to the outside.

The coil pattern 210 and the lead electrode 410 are formed on the first sheet 110. The sheet 110 may be provided in a substantially quadrangular plate shape having a predetermined thickness, and one side and another side orthogonal to the one side may be provided in, for example, a length ratio of 1:1. That is, the sheet 110 may have a square shape. However, the sheet 110 may have a rectangular shape in which one side is longer than the another side orthogonal thereto. For example, the sheet 110 may have a shape in which two sides opposed to each other are longer than the other two sides orthogonal thereto. That is, first and third sides on which external electrodes 3000 are formed may be provided such that the length thereof is longer than that of second and fourth sides on which connection electrodes 4000 are formed. The coil pattern 210 may be formed in a spiral shape wound in one direction from one area of the first sheet 110. For example, the coil pattern 210 may be formed with a predetermined number of turns by rotating in one direction, for example a counter-clockwise direction, from an area spaced apart toward one side by a predetermined distance from a central portion of the first sheet 110. The central portion may be defined as the point where diagonals of the first sheet 110 intersect, and the area spaced apart therefrom toward one side may be the area traveled in a straight line towards the center of one side. The coil pattern 210 may be formed by a method of printing, plating, depositing a conductive material such as a metallic material, or the like. Also, a line width and a distance between lines of the coil pattern 210 may be the same or different from each other. For example, the line width of the coil pattern 210 may be wider than the distance therebetween. The lead electrode 410 is formed in a linear shape such that the lead electrode 410 is connected to one end of the coil pattern 210 and extends to be exposed to a second side of the first sheet 110, and may be connected to a first connection electrode 4100. The lead electrode 410 may be formed so as to be exposed to the center of the second side of the first sheet 110. That is, the lead electrode 410 may be formed so as to be exposed to an area corresponding to approximately ½ of the length of the second side from one end of the second side. Also, the lead electrode 410 may be formed with a width which is wider than the line width of the coil pattern 210 and the same width as or narrower than the width of the first connection electrode 4100, and thus a contact area of the lead electrode 410 with the first connection electrode 4100 is increased, so that the sheet resistance between the lead electrode 410 and the first connection electrode 4100 may be reduced.

A coil pattern 220, a hole 310 filled with a conductive material, and a lead electrode 420 are formed on the second sheet 120. The second sheet 120 may be provided in a quadrangular plate shape having the same thickness and shape as the first sheet 110. The hole 310 is formed to penetrate the second sheet 120 in an area spaced apart by a predetermined distance toward one side from the central portion of the second sheet 120. The hole 310 is formed in an area corresponding to the starting point of the coil pattern 210 of the first sheet 110, and a conductive material such as a metal paste or the like may be filled therein. The hole 310 is filled with the conductive material to be connected to the coil pattern 210 formed on the first sheet 110. The coil pattern 220 may be formed with a predetermined number of turns by being wound in one direction so as not to be in contact with the hole 310 from an area spaced apart by a predetermined distance from the hole 310. For example, the coil pattern 220 may be formed by being wound in a counter-clockwise direction from an area spaced apart by a predetermined distance from the hole 310. The coil pattern 220 may be formed to overlap the coil pattern 210 of the first sheet 110. That is, a line width of the coil pattern 220 and a distance between the lines of the coil pattern 220 may be the same as the line width of the coil pattern 210 and the distance between the lines of the coil pattern 210, and the coil pattern 220 may be formed with the same number of turns as the coil pattern 210. The coil pattern 220 may also be formed to overlap an area where the coil pattern 210 is not formed. That is, the coil pattern 220 may also be formed in an area corresponding to the space between the lines of the coil pattern 210. The lead electrode 420 is connected to one end of the coil pattern 220. The lead electrode 420 may be formed in a linear shape so as to be exposed to a fourth side of the second sheet 120. That is, the lead electrode 420 is formed so as to be exposed to the fourth side opposed to the second side to which the lead electrode 410 of the first sheet 110 is exposed. The lead electrode 420 may be formed to be exposed to the central area of the fourth side of the second sheet 120. That is, the lead electrode 420 may be formed to be exposed to an area corresponding to approximately ½ of the length of the second side. The lead electrode 420 is connected to the second connection electrode 4200. Also, the lead electrode 420 is formed with a width that is wider than the line width of the coil pattern 220 and the same width as or narrower than the width of the second connection electrode 4200.

A coil pattern 230, holes 321 and 322 filled with a conductive material, and a lead electrode 430 are formed on the third sheet 130. The third sheet 130 may be provided in a quadrangular plate shape having the same thickness and shape as the first and second sheets 110 and 120. The coil pattern 230 may be formed in a spiral shape wound in one direction from an area spaced apart toward one side by a predetermined distance from the central portion of the third sheet 130. A starting point of the coil pattern 230 may be formed in an area corresponding to the hole 310 formed in the second sheet 120. That is, the coil pattern 230 may be formed with a predetermined number of turns by being wound in the, for example, counter-clockwise direction from the area corresponding to the hole 310 formed in the second sheet 120. Thus, the coil pattern 230 is connected to the coil pattern 210 of the first sheet 110 through the hole 321 filled with the conductive material and the hole 310 formed in the second sheet 120 and then filled with the conductive material to implement a first inductor. The coil pattern 230 may be formed to overlap the coil pattern 220 of the second sheet 120, and may be formed to overlap an area where the coil pattern 220 is not formed. Meanwhile, one end of the coil pattern 230 is connected to the lead electrode 430. The lead electrode 430 is connected to the one end of the coil pattern 230, and may be formed in a linear shape so as to be exposed to a third side of the third sheet 130. That is, the lead electrode 430 is formed to be led in a direction orthogonal to the lead electrode 420 formed on the second sheet 120. The lead electrode 430 may be formed in an area biased in one direction by a predetermined distance from the center of the third side of the third sheet 130. For example, the lead electrode 430 may be formed to be exposed in an area corresponding to approximately ⅔ of the length of the third side from the one end of the third side and may be connected to a first external electrode 3110. Also, the lead electrode 430 is formed in a width wider than the line width of the coil pattern 230, and narrower than or equal to the width of the first connection electrode 4100.

A coil pattern 240, a hole 330 filled with a conductive material, and a lead electrode 440 are formed in the fourth sheet 140. The fourth sheet 140 may be provided in a quadrangular plate shape having the same thickness and shape as the sheets 110, 120, and 130 formed thereunder. The coil pattern 240 may be formed in a spiral shape wound in one direction from an area spaced apart in one direction by a predetermined distance from a central portion of the fourth sheet 140. A starting point of the coil pattern 240 may be formed in an area corresponding to the hole 322 formed in the third sheet 130. That is, the coil pattern 240 may be formed with a predetermined number of turns by being wound in the, for example, counter-clockwise direction from the area corresponding to the hole 322 formed in the third sheet 130. Also, the hole 330 filled with the conductive material is formed in the starting point of the coil pattern 240. Thus, the coil pattern 240 is connected to the coil pattern 220 of the second sheet 120 through the hole 330 filled with the conductive material and the hole 322 formed in the third sheet 130 and then filled with the conductive material to implement a second inductor. The coil pattern 240 is formed to overlap the coil pattern 230 formed on the third sheet 130, and may be formed with the same number of turns. That is, the coil patterns 210 to 240 respectively formed on the sheets 110 to 140 may be formed with the same number of turns having the same line width and spacing. Meanwhile, one end of the coil pattern 240 is connected to the lead electrode 440. The lead electrode 440 may be formed in a linear shape so as to be exposed to a third side of the fourth sheet 140 from the one end of the coil pattern 240. That is, the lead electrode 440 may be formed spaced apart by a predetermined spacing from the lead electrode 430 in the same direction as a direction in which the lead electrode 430 is led. The lead electrode 440 is connected to a second external electrode 3220.

A fifth sheet 150 is provided between the first and second common mode noise filters 2100 and 2200. The sheet 150 is provided to prevent interference between the first and second common noise filters 2100 and 2200, and functions as a separation layer. The fifth sheet 150 may be formed to be thicker than the lower sheets 110 to 140 and the upper sheets 160 to 190. The fifth sheet 150 may also be provided in the form of a plurality of sheets, which have the same thickness as the sheets 110 to 140 and 160 to 190 and are laminated. Also, a spacing between the first and second common mode noise filters 2100 and 2200 is determined in accordance with the thickness of the fifth sheet 150, and a parasitic inductance of the connection electrodes 4000 may accordingly be adjusted. That is, the parasitic inductance of the connection electrodes 4000 increases as the two common mode noise filters 2100 and 2200 travel away from each other, and decreases as the two common mode noise filters 2100 and 2200 travel closer to each other. A maximum insertion loss frequency decreases as the parasitic inductance increases, and increases as the parasitic inductance decreases. Thus, the spacing between the common mode noise filters 2100 and 2200 may be adjusted by adjusting the thickness of the fifth sheet 150, the maximum insertion loss frequency may thus be adjusted, and noises with a variety of frequencies may thus be removed.

A coil pattern 250 and a lead electrode 450 are formed in the sixth sheet 160. The sixth sheet 160 may be provided in a substantially quadrangular plate shape having a predetermined thickness and having the same thickness and shape as the first to fourth sheets 110 to 140. The coil pattern 250 may be formed in a spiral shape wound in one direction, for example the counter-clockwise direction, from an area corresponding to the third hole 330 of the fourth sheet 140. The coil pattern 250 may be different from the coil patterns 210 to 240 provided thereunder in the number of turns. For example, the number of turns of the coil pattern 250 may be more than the number of turns of the coil patterns 210 to 240. A lead electrode 450 may be formed in a linear shape such that the lead electrode 450 is connected to one end of the coil pattern 250 and is exposed to a first side of the sixth sheet 160. The lead electrode 450 may be formed to overlap the lead electrode 440 formed on the fourth sheet 140, and is connected to the second external electrode 3210.

A coil pattern 260, a hole 340 filled with a conductive material, and a lead electrode 470 are formed on the seventh sheet 170. The seventh sheet 170 may be formed in a quadrangular plate shape having the same thickness and shape as the sixth sheet 160. The hole 340 is formed to penetrate the seventh sheet 170 in an area corresponding to the starting point of the coil pattern 250 of the sixth sheet 160, and may be filled with a metal paste, for example. The coil pattern 260 may be formed in a spiral shape wound in one direction, for example the counter-clockwise direction, from an area spaced apart by a predetermined spacing from the hole 340, for example the area corresponding to the hole 321 filled with the conductive material of the third sheet 130. The coil pattern 260 may be formed to overlap the coil pattern 250 of the sixth sheet 160, or may also be formed to overlap an area where the coil pattern 250 is not formed. Also, the coil pattern may be formed with the same number of turns having the same line width and spacing as the coil pattern 250. The lead electrode 460 is connected to one end of the coil pattern 260. The lead electrode 460 is formed in a linear shape spaced apart by a predetermined distance from the lead electrode 450 of the sixth sheet 160 so as to be exposed to a first side of the seventh sheet 170 and is connected to the first external electrode 3110.

A coil pattern 270, holes 351 and 352 filled with a conductive material, and a lead electrode 470 are formed on the eighth sheet 180. The hole 351 is formed in an area overlapping the starting point of the coil pattern 260 formed in the seventh sheet 170, and a conductive material is filled therein. The coil pattern 270 may be formed in a spiral shape wound in one direction, for example the counter-clockwise direction, from an area overlapping the hole 340 formed in the seventh sheet 170. Also, a hole 352 filled with the conductive material is formed in the starting point of the coil pattern 270. Thus, the coil pattern 270 is connected to the coil pattern 250 of the sixth sheet 160 through the hole 352 filled with the conductive material and the hole 340 formed on the seventh sheet 170 and then filled with the conductive material to implement a third inductor. Meanwhile, one end of the coil pattern 270 is connected to the lead electrode 270. The lead electrode 470 may be formed in a linear shape such that the lead electrode 470 is connected to one end of the coil pattern 270 and is exposed to the center of a fourth side of the eighth sheet 180. That is, the lead electrode 470 is formed to overlap the lead electrode 420 formed on the second sheet 120, and is connected to the second connection electrode 4200. The lead electrode 470 of the eighth sheet 180 and the lead electrode 420 of the second sheet 120 are formed so as to be led in the same direction and connected to the second connection electrode 4200, and thus the first and second common mode noise filters 2100 and 2200 may be connected to each other outside the laminate 1000.

A coil pattern 280, a hole 360 filled with a conductive material, and a lead electrode 480 are formed on the ninth sheet 190. The ninth sheet 190 may be formed in a quadrangular plate shape having the same thickness and shape as the sheets 160, 170, and 180 formed thereunder. The hole 360 may be formed in the same area as the hole 351 formed on the eighth sheet 180. Also, the spiral coil pattern 280 may be formed so as to be wound in one direction, for example the counter-clockwise direction, from the hole 360. The coil pattern 280 is connected to the coil pattern 260 formed on the seventh sheet 170 through the hole 360 and the hole 351 formed in the eighth sheet 180 to implement a fourth inductor. Meanwhile, one end of the coil pattern 280 is connected to the lead electrode 480. The lead electrode 480 may be formed in a linear shape so as to be exposed to a second side of the ninth sheet 180 from one end of the coil pattern 280. That is, the lead electrode 480 is formed to overlap the lead electrode 410 of the first sheet 110, and is connected to the first connection electrode 3100.

As described above, the coil pattern 210 of the first sheet 110 and the coil pattern 280 of the ninth sheet 190 are connected to the first connection electrode 4100 through the respective electrodes 410 and 480 thereof, and the coil pattern 220 of the second sheet 120 and the coil pattern 270 of the eighth sheet 180 are connected to the second connection electrode 4200 through the respective lead electrodes 420 and 470 thereof. Also, the coil pattern 230 of the third sheet 130 is connected to the first external electrode 4120 through the lead electrode 430, and the coil pattern 260 of the seventh sheet 170 is connected to the first external electrode 4112 through the lead electrode 460. The coil pattern 240 of the fourth sheet 140 is connected to the second external electrode 4220 through the lead electrode 440, and the coil pattern 250 of the sixth sheet 160 is connected to the second eternal electrode 4210 through the lead electrode 450. Meanwhile, the coil pattern 210 is connected to the coil pattern 230 through the holes 310 and 321 filled with the conductive material to form the first inductor, and the coil pattern 220 is connected to the coil pattern 270 through the holes 340 and 352 filled with the conductive material to form the second inductor. Also, the coil pattern 250 is connected to the coil pattern 270 through the holes 340 and 352 filled with the conductive material to form the third inductor, and the coil pattern 260 is connected to the coil pattern 280 through the holes 351 and 360 to form the fourth inductor.

Thus, at least two or more common mode noise filters 2000 may be connected to each other in series such that the coil patterns 200 are selectively connected to each other through the vertical connection line, i.e. the holes 300 filled with the conductive material, in the sheets 100, led to the outside through the lead electrode 400, and connected to the external electrodes 3000 and the connection electrodes 4000. Also, in the two or more common mode noise filters 2000, the coil patterns thereof may respectively be formed with different numbers of turns from each other, and the two or more common mode noise filters 2000 may thus have two or more impedance characteristics. The parasitic inductance of the connection electrodes 4000 is changed in accordance with the spacing between the at least two or more common mode noise filters 2000, and thus the characteristics of the common mode noise filters 2000 may be changed such that the maximum insertion loss frequency or the like is adjusted.

Figure 5:
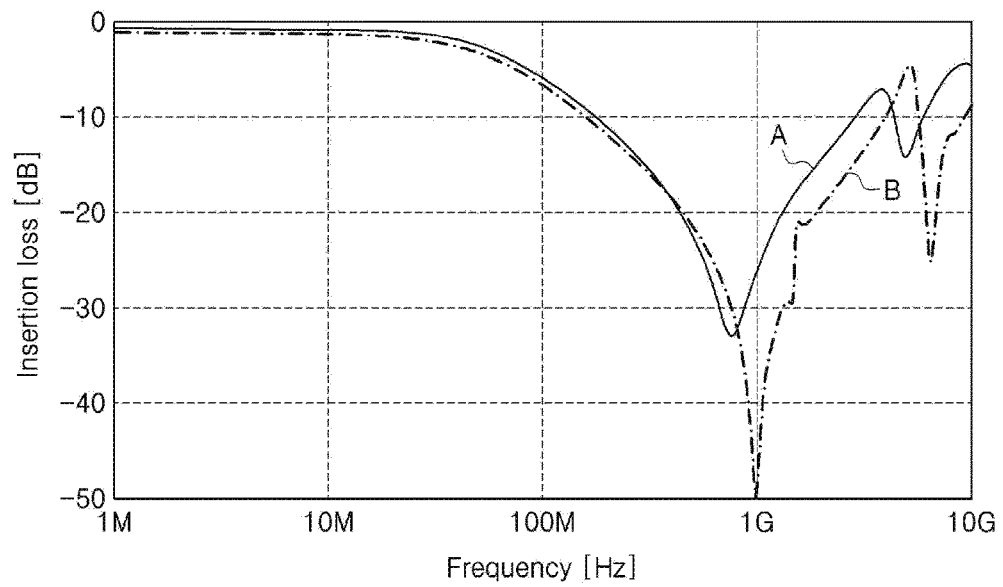
FIG. 5 is a graph comparing characteristics of related art and the present disclosure.

FIG. 5 is a graph for comparing characteristics of circuit protection devices in accordance with an embodiment of the present disclosure and a related art. That is, the circuit protection device of the related art includes only one common mode noise filter, while the circuit protection device of the present disclosure includes two common mode noise filters connected to each other in series by a connection electrode. In the circuit protection device (A) of the related art, an insertion loss is approximately −33 dB, and a frequency is approximately 0.75 GHz. However, in the circuit protection device (B) of the present disclosure, the insertion loss is approximately −50 dB, and the frequency is approximately 2 GHz. Since a noise removal characteristic is excellent as the insertion loss is higher, the insertion loss characteristic in the present disclosure is higher than that of the related art, and thus the noise removal characteristic is identified to be excellent. Also, a bandwidth in the present disclosure (B) is wider than that of related art (B). For example, when the insertion loss is −30 dB, the bandwidth in the present disclosure (B) is wider than that of the related art (A). Consequently, in the present disclosure, since the insertion loss is low, the noise removal characteristic may be improved, and since the bandwidth is wide, the noises with various frequencies may be removed.

Figure 6:
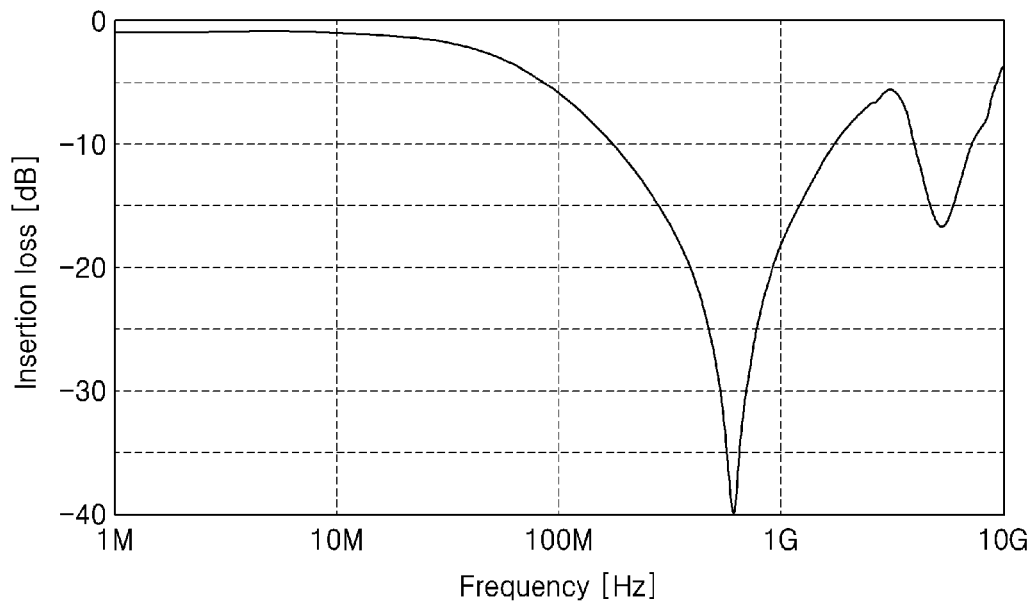
FIGS. 6 and 7 are graphs illustrating frequency characteristics in accordance with a parasitic inductance.
Figure 7:
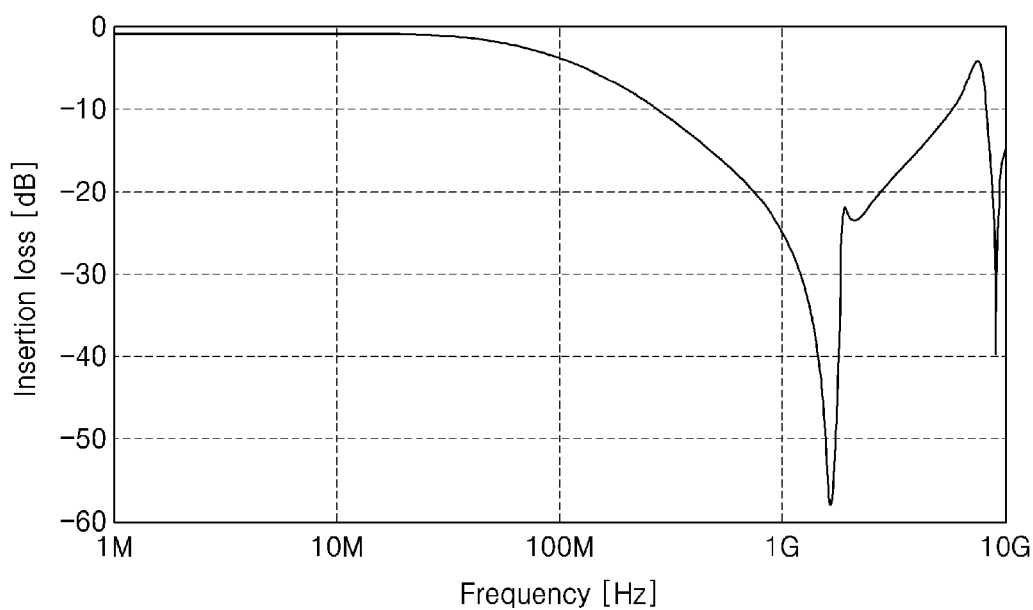

FIGS. 6 and 7 are frequency characteristics graphs in accordance with a spacing between common mode noise filters of a circuit protection device in accordance with an embodiment of the present disclosure. As illustrated in FIG. 6, as the spacing between two common mode noise filters increases, a parasitic inductance of a connection electrode increases, and thus an insertion loss frequency decreases. The spacing between the two common mode noise filters in FIG. 6 is approximately 160 μm, and the insertion loss frequency is approximately 0.6 GHz. Meanwhile, as illustrated in FIG. 7, as the spacing between the two common mode noise filters decreases, the parasitic inductance of the connection electrode decreases, and the insertion loss frequency thus increases. In FIG. 7, the spacing between the two common mode noise filters is approximately 160 μm, and the insertion loss frequency is approximately 1.6 GHz.

Figure 8:
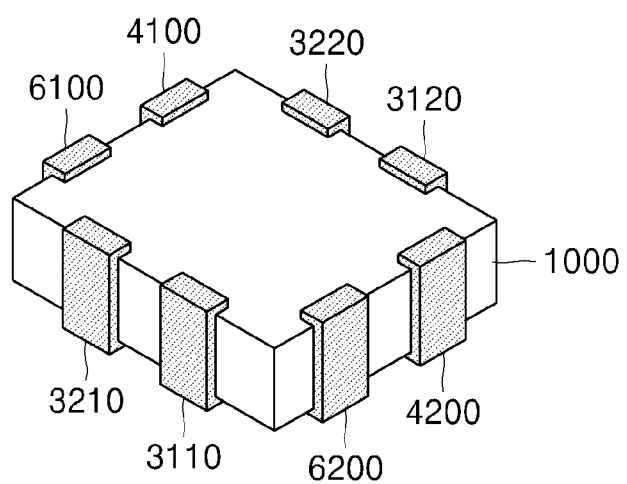
FIG. 8 a perspective view illustrating an assembled circuit protection device in accordance with another exemplary embodiment of the present disclosure.

Meanwhile, the circuit protection device in accordance with an embodiment of the present disclosure may be provided in an assembly of a plurality of common mode noise filters 2000 and an ESD protection device. That is, at least two or more common mode noise filters 2000 and the ESD protection device are assembled together to implement the circuit protection device. Such a circuit protection device in accordance with another embodiment of the present disclosure may be described below with reference to FIGS. 8 and 9. FIG. 8 is an assembled perspective view of a circuit protection device in accordance with another embodiment of the present disclosure, and FIG. 9 is an exploded perspective view of the same.

Figure 9:
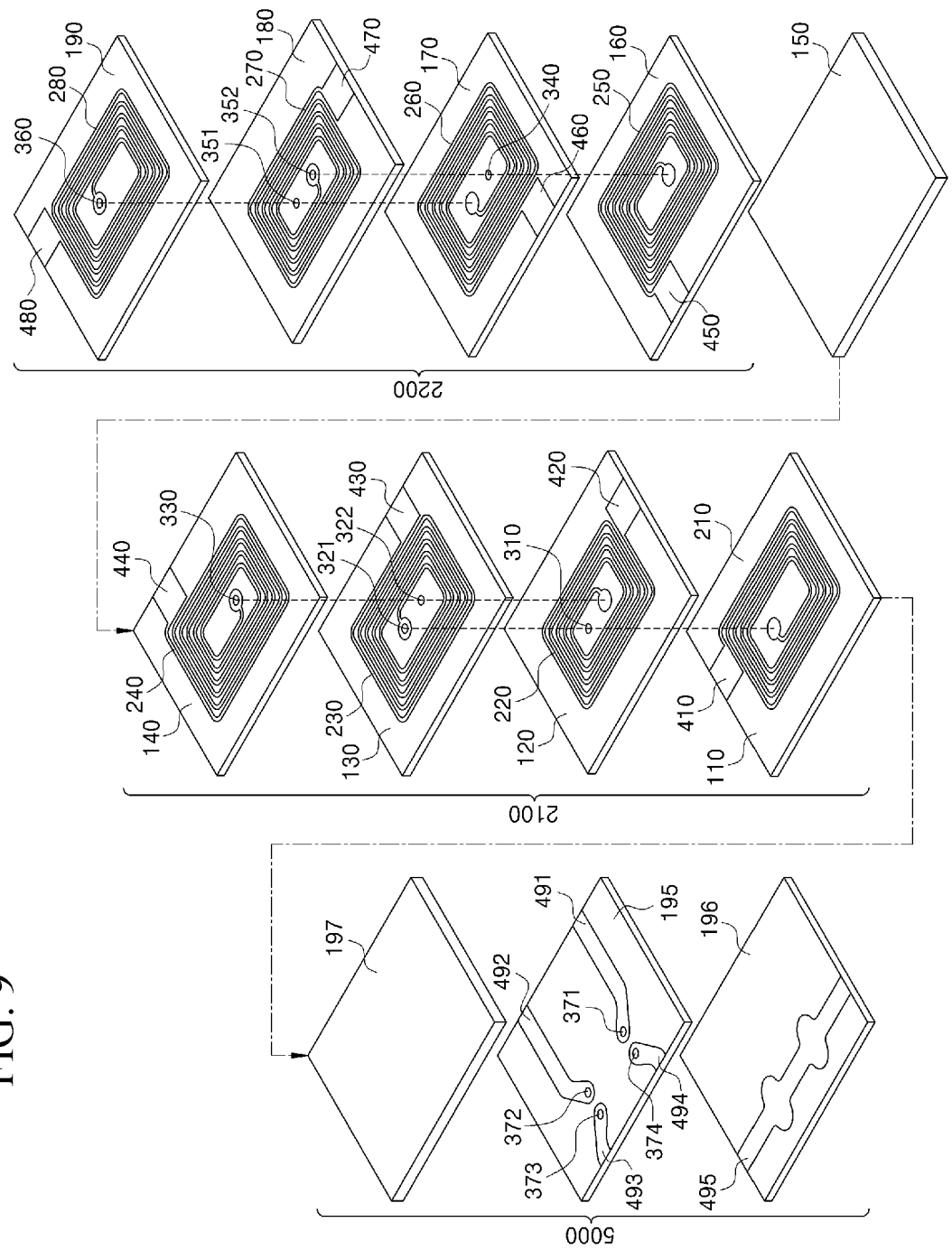
FIG. 9 is an perspective view illustrating an exploded circuit protection device in accordance with another exemplary embodiment of the present disclosure.

Referring to FIGS. 8 and 9, a circuit protection device in accordance with another embodiment of the present disclosure includes a laminate 1000 in which a plurality of insulation sheets 100 are laminated, and at least two or more common mode noise filters 2100 and 2200 (2000) each including a plurality of coil patterns 200, and an ESD protection device 5000 are provided in the laminate 1000. Also, the circuit protection device may further include: external electrodes 3100 and 3200 (3000) which are formed on two side surfaces of the laminate 1000 opposed to each other and connected to at least two or more common mode noise filters 2000; connection electrodes 4100 and 4200 (4000) which are formed on at least one side surface of the laminate 1000 and configured to connect at least two or more common mode noise filters 2000 to each other; and external electrodes 6000 which are formed on two side surfaces of the laminate 1000 opposed to each other and connected to the ESD protection device 5000. The external electrodes 6000 may be formed on the same side surface as the connection electrodes 4000 and spaced apart from the connection electrode 4000. That is, in the circuit protection device in accordance with another embodiment of the present disclosure, at least two or more common mode noise filters 2000 each including the plurality of coil patterns 200 are connected to each other in series by the external electrodes 3000 and the connection electrodes 4000, and the ESD protection device 5000 is provided spaced apart from the common mode noise filters 2000.

Since the common mode noise filter 2000 in accordance with another embodiment of the present disclosure is the same as the common mode noise filter 2000 in accordance with the foregoing embodiment of the present disclosure, a description thereof is omitted. However, lead electrodes 410, 420, 470, and 480 connected to the connection electrodes 4000 are formed such that the lead electrodes 410, 420, 470, and 480 are not led to the central portion of second and fourth sides of the sheets 110, 120, 180, and 190, but are led so as to be biased toward one direction. Thus, the external electrodes 6000 connected to the ESD protection device 5000 and the connection electrodes 4000 may be formed spaced apart from each other. That is, the lead electrodes 410, 420, 470, and 480 connected to the connection electrodes 4000 are formed so as to be exposed to an area corresponding to approximately, for example, ⅓ of third and fourth sides.

The ESD protection device 5000 includes a plurality of sheets 195 and 196, in which each of lead electrodes 491 to 494 and holes 371 to 374 are selectively formed and which are laminated. The sheets 195 and 196 may be provided in a quadrangular plate shape having the same thickness and shape as sheets 100 constituting the common mode noise filters 2000.

A plurality of lead electrodes 491, 492, 493, and 494 (490) are formed on the upper surface of the sheet 195. The plurality of lead electrodes 490 may be formed on the same location as lead electrodes 430, 440, 450, and 460 of the plurality of common mode noise filters 2000 connected to the external electrodes 3000. That is, the lead electrode 491 is formed to overlap the lead electrode 430, the lead electrode 492 is formed to overlap the lead electrode 440, the lead electrode 493 is formed to overlap the lead electrode 450, and the lead electrode 494 is formed to overlap the lead electrode 460. Thus, the lead electrode 491 is connected to a first external electrode 3120, the lead electrode 492 is connected to a second external electrode 3220, the lead electrode 493 is connected to a second external electrode 3210, and the lead electrode 494 is connected a first external electrode 3110. Also, a plurality of holes 371, 372, 373, and 374 are formed in the sheet 195, and the plurality of holes 371 to 374 may be respectively formed in one ends of the plurality of lead electrodes 491 to 494. Also, each of the plurality of holes 371 to 374 is filled with an ESD protection material. The ESD protection material may be formed of a mixture material obtained by mixing at least one conductive material selected from $RuO_2$, Pt, Pd, Ag, Au, Ni, Cr, W, or the like with an organic material such as Polyvinyl Alcohol (PVA) or Polyvinyl Butyral (PVB). Also, the ESD protection material may also be formed by further adding an insulation ceramic material such as $Al_3O_3$ or a varistor material such as ZnO to the mixture material.

A sheet 196 is provided under the sheet 195, and a lead electrode 495 is formed thereon. The lead electrode 495 may be formed so as to be respectively exposed from one side of the sheet 195 to another side opposed thereto. That is, the lead electrode 495 is formed so as to be respectively exposed to one side to which the lead electrodes 491 to 494 formed on the sheet 195 are exposed and another side orthogonal thereto. The lead electrode 495 is connected to external electrodes 6000 formed on two side surfaces of the laminate 1000 opposed to each other. Also, a predetermined area of the lead electrode 495 is connected to the holes 371 to 374 of the sheet 195, and the area where the holes 371 to 374 are connected may be formed wider in width than other areas thereof for the connection.

Also, a sheet 197 may be provided on the sheet 195. The sheet 197 is provided for separation of the common mode noise filter 2000 and the ESD protection device 5000, and may be formed in a thickness by which an interference therebetween is suppressed. The sheet 197 may be formed by a plurality of sheets having the same thickness as the sheets 195 and 196 laminated.

In the ESD protection device 5000, the ESD protection material filled in the holes 371 to 374 exists in a state in which a conductive material and an insulating material are mixed at a predetermined ratio. That is, conductive particles exist in the insulating material, and when a voltage equal to or less than a predetermined voltage is applied to the lead electrodes 491 to 494, an insulated state is maintained, and when the voltage higher than the predetermined voltage is applied to the lead electrodes 491 to 494, a discharge occurs among the conductive particles, so that a voltage difference among the corresponding lead electrodes 491 to 494 is reduced In the composite circuit protection device which includes a plurality of common mode noise filters 2000 each composed of two inductors in accordance with another embodiment of the present disclosure and an ESD protection device 5000, the first and second external electrodes 3000 are connected between a signal input terminal used for an electronic apparatus and a system for connection, and third external electrodes 6000 are connected to a ground terminal such that a common mode noise is removed, and a static electricity introduced to the input and output terminals may also be discharged to the ground terminal as well. Also, as the ESD protection device 5000 is connected to the ground terminal between the input and output terminals, when an unwanted voltage equal to or less than a predetermined voltage is applied between two terminals, a discharge occurs among the conductive particles of the ESD protection material to flow the current to the ground terminal so that a voltage difference between the two terminals of the corresponding circuit protection device is reduced. Since the two terminals of the circuit protection device are not in conductive state, the input signal is transmitted as it is to the input and output terminals without being distorted. That is, in the circuit protection device, when static electricity is generated, the corresponding static electricity is discharged to the ground through the corresponding circuit protection device such that the circuit is protected, and the signal transmitted and received by the system is maintained as it is at the same time.

While the above embodiments have described cases in which at least two or more common mode noise filters 2000 are connected to each other in series through the external electrodes 3000 and the connection electrodes 4000, in another embodiment of the present disclosure, at least two or more common mode noise filters 2000 may also be provided in parallel. That is, at least two or more coil patterns 200 of each of the common mode noise filters 2000 are connected to each other by using the connection electrodes 4000, and the common mode noise filters 2000 are connected to each other by using different external electrodes 3000 such that the plurality of common mode noise filters 2000 may be provided in parallel. Such a circuit protection device in accordance with another embodiment of the present disclosure is described with reference to the drawings below.

Figure 10:
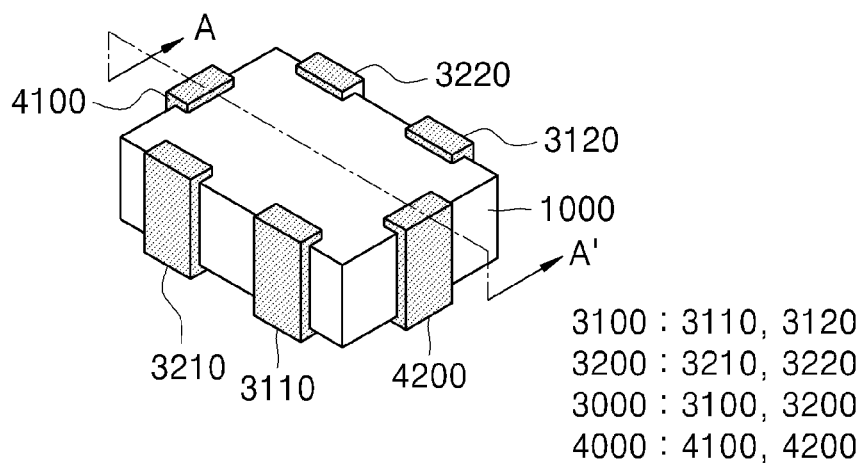
FIG. 10 is a perspective view illustrating an assembled circuit protection device in accordance with yet another exemplary embodiment of the present disclosure.
Figure 11:
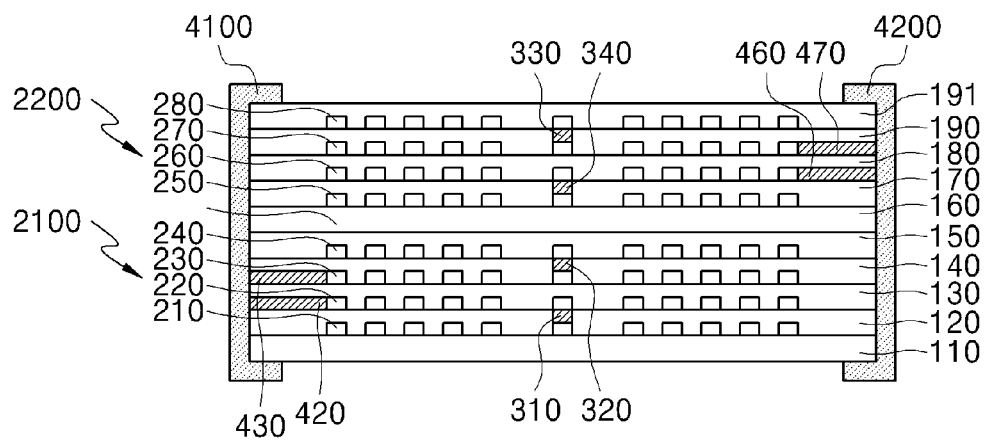
FIG. 11 is a sectional view taken along line A-A' of FIG. 10.
Figure 12:
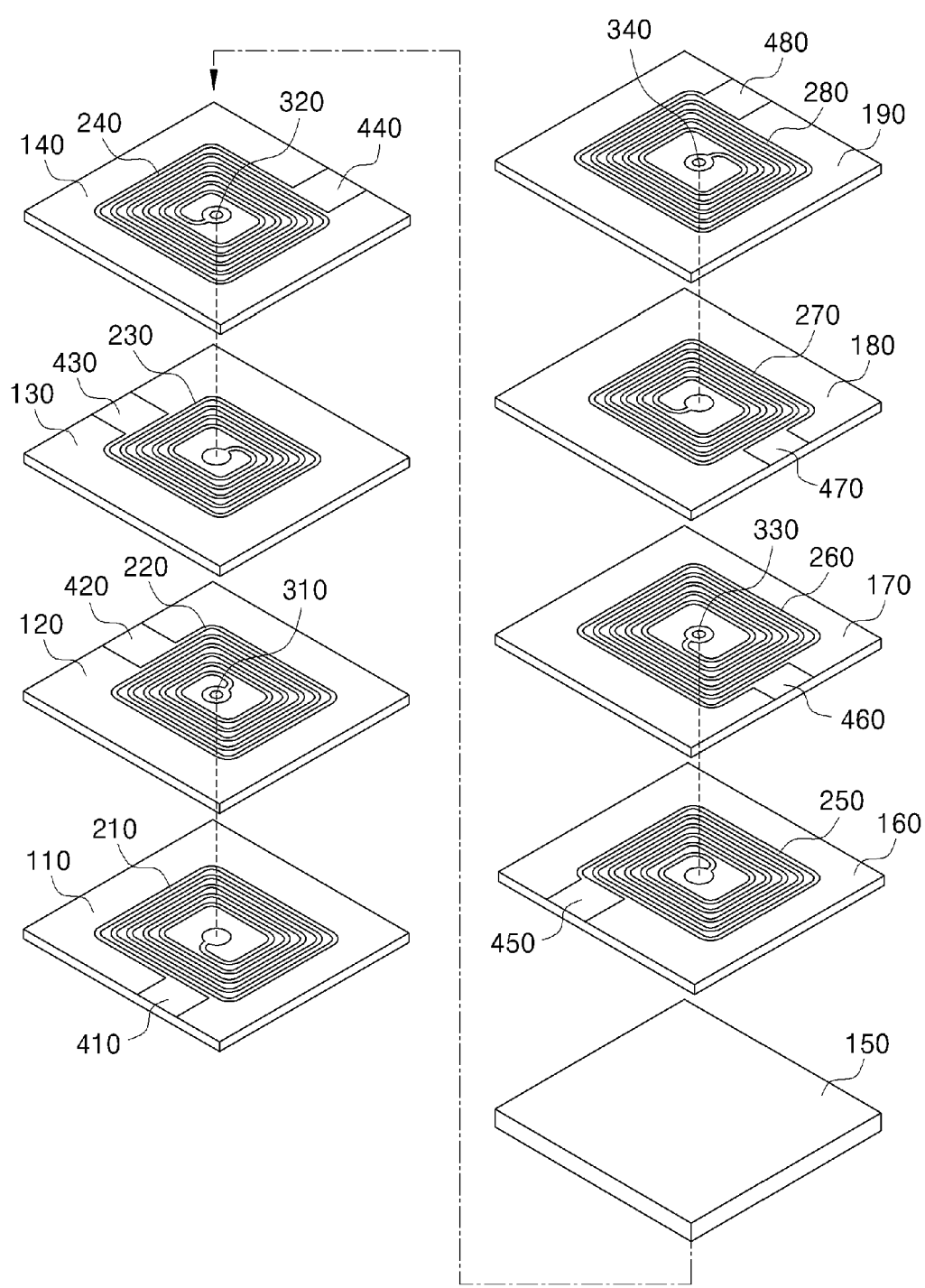
FIG. 12 is a perspective view illustrating an exploded circuit protection device in accordance with yet another exemplary embodiment of the present disclosure.

FIG. 10 is an assembled perspective view of a circuit protection device in accordance with yet another embodiment of the present disclosure, FIG. 11 is a sectional view taken along line A-A', and FIG. 12 is an exploded perspective view.

Referring to FIGS. 10 to 12, a circuit protection device in accordance with yet another embodiment of the present disclosure includes a laminate 1000 in which a plurality of insulation sheets are laminated, and at least two or more common mode noise filters 2100 and 2200; 2000 are provided in the laminate 1000. Also, the circuit protection device may further include external electrodes 3100 and 3200 (3000) which are formed on two side surfaces of the laminate 1000 opposed to each other and respectively connected to at least two or more common mode noise filters 2000, and connection electrodes 4100 and 4200 (4000) which are formed on one side surface of the laminate 1000 and configured to connect respective coil patterns of the common mode noise filters 2000. That is, in an embodiment and another embodiment of the present disclosure, the external electrodes 3000 and the connection electrode 4000 are connected through the coil patterns 200 and the lead electrodes 400 of the common mode noise filters 2000 different from each other, but in yet another embodiment of the present disclosure, the external electrodes 3000 and the connection electrodes 4000 connect the coil patterns 200 of the same common mode noise filters 2000 through the lead electrodes 400.

The laminate 1000 is formed by a plurality of insulation sheets 110 to 190 laminated, and at least two or more common mode noise filters 2000 are provided inside the laminate 1000. At least two or more common mode noise filters 2000 are provided, for example, in a direction in which the sheets 110 to 190 are laminated, i.e. the vertical direction, and are provided spaced apart by a predetermined distance from each other.

The common mode noise filters 2000 may include: a plurality of coil patterns 200 selectively formed on the plurality of sheets 110 to 190; holes 300 filled with a conductive material; and lead electrodes 400. That is, at least two or more coil patterns 210 to 280 (200) are respectively formed on the plurality of sheets 110 to 190, are provided in a direction in which the sheets 100 are laminated, i.e. the vertical direction, and are connected to each other through the holes 310 to 340; 300 filled with the conductive material, i.e. vertical connection lines. Also, at least two or more coil patterns 200 among the plurality of coil patterns 200 constituting one of the common mode noise filters 2000 are connected to each other through the connection electrodes 4000 outside the laminate 1000. Thus, the plurality of coil patterns, for example, four coil patterns connected in a vertical direction respectively form one of the common mode noise filters 2000, and for example, two common mode noise filters 2100 and 2200; 2000 having a sheet 150, which has a predetermined thickness, therebetween are spaced apart in the vertical direction, and laminated.

A coil pattern 210 is formed on a first sheet 110, a coil pattern 220 and a hole 310 filled with a conductive material are formed on the second sheet 120, a coil pattern 230 is formed on the third sheet 130, and a coil pattern 240 and a hole 320 filled with the conductive material are formed on the fourth sheet 140. The coil pattern 210 on the first sheet 110 and the coil pattern 220 on the second sheet 120 are connected to each other through the hole 310 filled with the conductive material, and the coil pattern 230 on the third sheet 130 and the coil pattern 240 on the fourth sheet 140 are connected to each other through the hole 320 filled with the conductive material. Also, the coil pattern 220 formed on the second sheet 120 and the coil pattern 230 formed on the third sheet 130 are connected to each other by a connection electrode 4100. Thus, the coil pattern 210 is connected to the coil pattern 220 through the hole 310 filled with the conductive material, i.e. the vertical connection line, the coil pattern 220 is connected to the coil pattern 230 through an external connection electrode 3100, and the coil pattern 230 is connected to the coil pattern 240 through the hole 320 filled with the conductive material, i.e. the vertical connection line, so that a first common mode noise filter 2100 is implemented. That is, the coil patterns 210, 220, 230, and 240 are connected to each other through the hole 310 filled with the conductive material, the connection electrode 4100, and the hole 320 filled with the conductive material to form the first common mode noise filter 2100.

Also, a second common mode noise filter 2200 is formed on the first common mode noise filter 2100 with a sheet 150 having a predetermined thickness in-between, and is equally formed as the first common mode noise filter 2100. That is, the coil pattern 250 formed on the sheet 160 is connected to the coil pattern 260 through the hole 330 filled with the conductive material and formed on the sheet 170, i.e. the vertical connection line, the coil pattern 260 is connected to the coil pattern 270 formed on the sheet 180 through the connection electrode 4200, and the coil pattern 270 is connected to the coil pattern 280 formed on the sheet 190 through the hole 340 which is formed in the sheet 190 and then filled with the conductive material, i.e. the vertical connection line. Thus, the coil patterns 250, 260, 270, and 280 are connected to each other through the hole 330 filled with the conductive material, the connection electrode 4200, and the hole 340 filled with the conductive material to form the second common mode noise filter 2200. Meanwhile, since the number of turns of the coil patterns forming the first and second common mode noise filters 2100 and 2200 are different from each other, one circuit protection device may have at least two or more impedance characteristics.

The external electrodes 3000 may be respectively provided on two side surfaces opposed to each other of the laminate 1000. Also, the external electrodes 3000 may be provided in one each on first and third side surfaces of the common mode noise filters 2100 and 2200. Thus, two external electrodes 3000 may be formed on the first and third side surfaces respectively against two common mode noise filters 2100 and 2200. That is, in the external electrodes 3000, first external electrodes 3110 and 3120 being connected to the first common mode noise filter 2100 are formed on the first and third side surfaces to be opposed to each other, second external electrodes 3210 and 3220 connected to the second common mode noise filter 2200 are formed on the first and third sides to be opposed to each other spaced apart from the first external electrodes 3110 and 3120. The external electrodes 3000 are respectively connected to the first and second common mode noise filters 2100 and 2200 inside the laminate 1000, and may be connected to input and output terminals outside the laminate 1000. For example, the external electrodes 3110 and 3210 formed on the first side surface of the circuit protection device are connected to a signal input terminal, and the corresponding external electrodes 3120 and 3220 formed on the third side surface may be connected to the output terminal such as the system.

The connection electrodes 4000 are provided to connect at least two coil patterns 200 of each of common mode noise filters 2000 to each other. That is, the common mode noise filters 2000 include a plurality of coil patterns 200 formed on different layers from each other, at least two coil patterns 200 are connected to each other through the vertical connection line inside the laminate 1000, and at least two coil patterns 200 not connected through the vertical connection line are connected to each other by the connection electrodes 4000. For example, in the first common mode noise filter 2100, the coil pattern 210 of the first sheet 110 and the coil pattern 220 of the second sheet 120 are connected to each other through the hole 310 filled with the conductive material, the coil pattern 230 of the third sheet 130 and the coil pattern 240 of the fourth sheet 140 are connected to each other through the hole 320 filled with the conductive material, and the coil pattern 220 of the second sheet 120 and the coil pattern 230 of the third sheet 130 are connected to each other through the connection electrode 4100. The connection electrodes 4000 may be formed outside the laminate 1000, and may be formed on at least one side surface of the laminate 1000 on which the external electrodes 3000 are not formed. Also, in the connection electrodes 4000, a first connection electrode 4100 connected to the first common mode noise filter 2100 is formed on the second side surface of the laminate 1000, and a second connection electrode 4200 connected to the second common mode noise filter 2200 is formed on the fourth side surface of the laminate 1000. The connection electrodes 4000 functions to connect at least two coil patterns 200 of each of the common mode noise filters 2000 to each other, but are not connected to other circuits, such as the input and output terminals, the ground terminal, or the like from the outside.

As described above, the circuit protection device in accordance with yet another embodiment of the present disclosure includes at least two or more common mode noise filters 2000 spaced apart in a vertical direction by a predetermined distance from each other, wherein each of the common mode noise filters 2000 includes: the plurality of coil patterns 200; the holes 300 filled with the conductive material; and the lead electrodes 400, and the plurality of coil patterns 200 constituting one common mode noise filter 2000 are connected to each other through the holes 300 filled with the conductive material and the connection electrodes 4000. Thus, since at least two or more common mode noise filters 2000 are laminated in a vertical direction, and are connected by different external electrodes 3000 from each other, at least two or more common mode noise filters 2000 may be provided in parallel inside one laminate 1000.

Meanwhile, in yet another embodiment of the present disclosure, at least two or more common mode noise filters 2000 are laminated in a vertical direction but not limited thereto, in still another embodiment, the two or more common mode noise filters 2000 may also be arranged in a horizontal direction.

Also, in the circuit protection device in accordance with above embodiments of the present disclosure, the plurality of common mode noise filters 2000 are described such that the coil patterns formed on the upper and lower portion thereof are respectively connected to each other to implement the inductors. However, the common mode noise filters 2000 may be configured such that the coil patterns surround a magnetic core. That is, a hole is formed in the central area of the sheets 110 to 190, the hole is then filled with conductive material such that the magnetic core is provided in up and down direction, and the inductor configured to surround the magnetic in the up and down direction may be implemented.

In accordance with embodiments of the present disclosure, a circuit protection device may connect at least two or more common mode noise filters to each other in series using an external electrode provided outside a laminate or a connection electrode. Further, a parasitic inductance of the connection electrode changes in accordance with a distance between the common mode noise filters, and thus an insertion loss frequency may be adjusted.

And further, an in-depth insertion loss characteristic in a desired frequency band may be implemented by connecting at least two or more common mode noise filters in series, so that a wider bandwidth may be implemented.

Meanwhile, in the two or more common mode noise filters, coil patterns may be respectively formed to have different number of turns from each other, and the two or more common mode noise filters may thus have two or more impedance characteristics.

Although the circuit protection device has been described with reference to the specific embodiments, it is not limited thereto. Therefore, it will be readily understood by those skilled in the art that various modifications and changes can be made thereto without departing from the spirit and scope of the present invention defined by the appended claims.

What is claimed is:

1. A circuit protection device comprising:
a laminate in which a plurality of sheets are laminated; at least two or more noise filters provided in the laminate and spaced apart by a predetermined distance from each other, each of the noise filters having a plurality of coil patterns;
an external electrode provided outside the laminate and connected to the two or more noise filters; and
a connection electrode spaced apart from the external electrode and configured to connect at least two among the at least two or more noise filters; and
wherein a parasitic inductance and an insertion loss frequency are adjusted in accordance with a distance between the two or more noise filters,
wherein the insertion loss frequency is adjusted to approximately 0.4 GHz to approximately 5 GHz in accordance with the distance between the noise filters.

2. The circuit protection device of claim 1, wherein the two or more noise filters are provided spaced apart by a predetermined distance from each other in a direction in which the sheets are laminated.

3. The circuit protection device of claim 2, wherein the connection electrode is provided outside the laminate, or is formed inside the laminate to penetrate the plurality of sheets.

4. The circuit protection device of claim 3, wherein the two or more noise filters comprises a plurality of coil patterns spaced apart from each other in a direction in which the sheets are laminated, and at least one of the coil patterns of each of the two or more noise filters shares the connection electrode, so that connected to each other in series.

5. The circuit protection device of claim 4, wherein the external electrode is connected to one terminal and to the other terminal of a circuit, and the connection electrode is not connected to the circuit.

6. The circuit protection device of claim 5, wherein the noise filter comprises:
the plurality of coil patterns respectively formed on the plurality of sheets;
a plurality of vertical connection lines formed on a selected sheet to connect at least two or more of the plurality of coil patterns; and
a plurality of lead electrodes led to outside from each of the plurality of coil patterns to be selectively connected to the external electrode and the connection electrode.

7. The circuit protection device of claim 6, wherein a first noise filter comprises first to fourth coil patterns in a direction in which the sheets are laminated, the first and second coil patterns being respectively connected to any one of the third or fourth coil pattern to constitute first and second inductors, respectively, and
wherein a second noise filter is spaced apart from the first noise filter and comprises fifth to eighth coil patterns in the direction in which the sheets are laminated, the fifth and sixth coil patterns being respectively connected to any one of the seventh or eighth coil pattern to constitute third and fourth inductors, respectively.

8. The circuit protection device of claim 7, wherein two coil patterns selected from the first to fourth coil patterns are respectively connected to two coil patterns selected from the fifth to eighth coil patterns through one sided connection electrode and another sided connection electrode.

9. The circuit protection device of claim 5, wherein the two or more noise filters are different from each other in a number of turns of the coil patterns.

10. The circuit protection device of claim 5, further comprising a magnetic core formed in the center of at least one coil pattern of the two or more noise filters.

11. The circuit protection device of claim 5 further comprising an ESD protection device provided in a lower or upper side of the two or more noise filters to shield the ESD.

12. The circuit protection device of claim 11, wherein the ESD protection device comprises a plurality of holes filled with an ESD protection material and a second lead electrode led to outside from the holes to be connected to the external electrode.

13. The circuit protection device of claim 12, wherein the ESD protection device further comprises a third lead electrode formed in a direction orthogonal to the second lead electrode.

14. The circuit protection device of claim 13, wherein the third lead electrode further comprises a second external electrode which is spaced apart from the external electrode and the connection electrode and is connected to a ground terminal.

* * * * *